United States Patent [19]
Ouchi et al.

[11] 4,242,695
[45] Dec. 30, 1980

[54] LOW DARK CURRENT PHOTO-SEMICONDUCTOR DEVICE

[75] Inventors: Hirobumi Ouchi; Toji Mukai, both of Hitachi, Japan

[73] Assignee: Hitachi, Ltd., Japan

[21] Appl. No.: 6,913

[22] Filed: Jan. 26, 1979

[30] Foreign Application Priority Data

Jan. 27, 1978 [JP] Japan .................................. 53-8671

[51] Int. Cl.³ ...................... H01L 27/14; H01L 29/48
[52] U.S. Cl. .................................... 357/30; 357/15; 357/41
[58] Field of Search .............................. 357/30, 41, 15

[56] References Cited

U.S. PATENT DOCUMENTS

| | | | |
|---|---|---|---|
| 3,534,231 | 10/1970 | Biard | 317/235 |
| 3,964,083 | 6/1976 | Lohstroh | 357/30 |
| 4,087,833 | 5/1978 | Tseng | 357/24 |

*Primary Examiner*—Martin H. Edlow
*Attorney, Agent, or Firm*—Craig and Antonelli

[57] ABSTRACT

A photo-semiconductor device includes an active region of semiconductor material in which carriers contributing to a photocurrent are generated by the irradiation of incident light. On one surface of the active region is formed a main junction towards which those carriers move. In the active region is buried an additional region to form at the interface between the additional and active regions an additional junction which attracts a substantial portion of thermally generated carriers. The remaining portion of the thermally generated carriers is partially recombined internally and partially attracted to the main junction. Thus, dark current is reduced.

20 Claims, 6 Drawing Figures

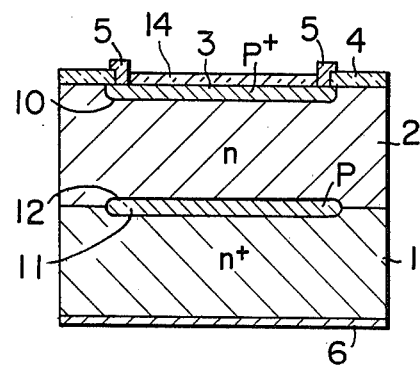
FIG. 1
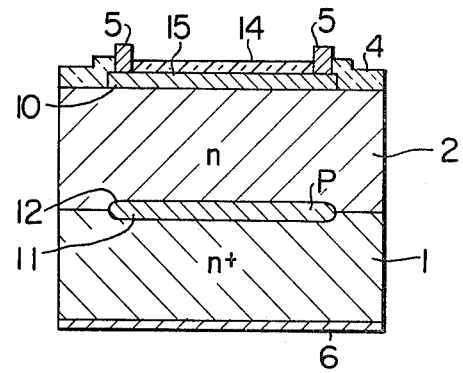
FIG. 2
FIG. 3
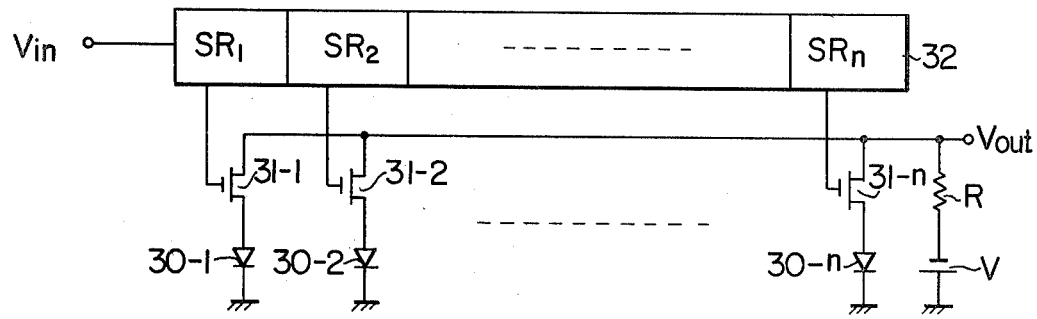
FIG. 5
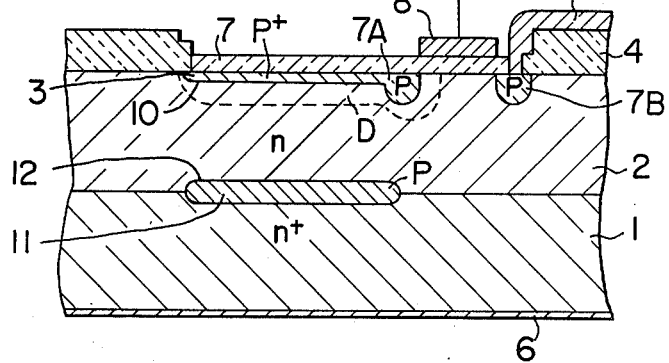
FIG. 4
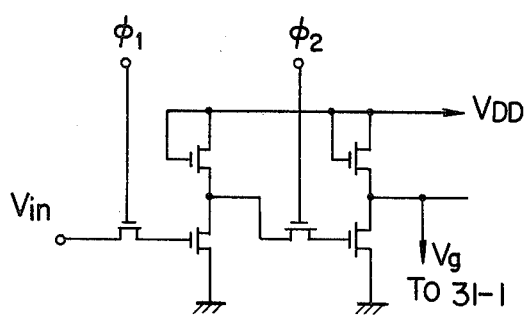
FIG. 6
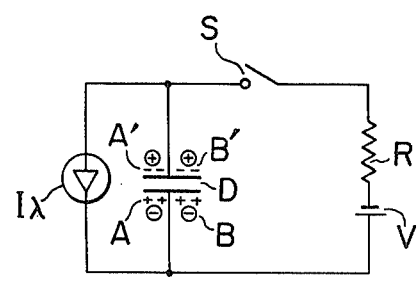

LOW DARK CURRENT PHOTO-SEMICONDUCTOR DEVICE

BACKGROUND OF THE INVENTION

This invention relates to a photo-semiconductor device, and more particularly to such a device in which dark current is reduced.

Photo-semiconductor devices such as photodiodes are usually used for light detection. Light measuring equipment is required to be able to detect even a weak light signal with high accuracy so that it is necessary to reduce the internal noise (i.e. dark current) of the photodetector to the lowest minimum possible. Especially, a spectrophotometer, for example, must treat light having a rather wide range of wavelengths covering visible and ultraviolet regions. However, an ordinary semiconductor light receiving element is usually less sensitive to ultraviolet light than to visible light. It is therefore necessary to reduce the dark current of a detector used for shorter wavelengths to a smaller value than the dark current of a detector used for longer wavelengths.

A typical type of conventional photodiode has a $p^+nn^+$ or $n^+pp^+$ structure. For convenience of explanation, a reference will be made to a $p^+nn^+$ type photodiode. The dark current $I_D$ of the $p^+nn^+$ photodiode is governed by the high resistance region side of the $p^+n$ junction, i.e. an n-type layer serving substantially as an active region for light absorption. When the thickness of the n-type layer is much greater than the diffusion length of the minority carriers in the n layer, the dark current $I_D$ is given, as well known, by the following equation:

$$I_D \simeq S_q D_p P_n / L_p \qquad (1)$$

where S designates the area of the junction, q the magnitude of the electronic charge (elementary charge), $D_p$ the diffusion constant of the minority carriers in the n layer, $P_n$ the number of the minority carriers in thermal equilibrium in the n layer, and $L_p$ the diffusion length of the minority carriers in the n layer. If the thickness of the n layer or active region is smaller than $L_p$, the dark current $T_D$ takes a value smaller than that given by the equation (1).

Therefore, in order to reduce the dark current of a conventional photodiode, it is necessary to decrease the thickness of the active region or to increase the impurity concentration of the active region. For example, U.S. Pat. No. 3,534,231 has proposed a photodiode structure in which the dark current or bulk leakage current is reduced by making the n layer or active region so thin that a highly doped $n^+$ layer may be disposed within the diffusion length of the $p^+n$ junction. (In fact, the U.S. Patent shows an $n^+pp^+$ structure.) Further, the U.S. Pat. No. 3,534,231 has also proposed a structure in which a $p^+$ layer is substituted for the $n^+$ layer and in which the dark current is reduced by substantially making the n layer or active region so thin that the $p^+$ layer may be disposed within the diffusion length of the front $p^+n$ junction. (In fact, the U.S. Patent shows an $n^+pn^+$ structure.)

These approaches are indeed successful in the reduction of dark current, but the resultant structure causes the degradation of photo-electric conversion efficiency. Namely, the reduction of the thickness of the active region leads to the overall decrease in the absorption of light in the active region and also to the inefficient absorption of light having a small absorption coefficient. The absorption coefficient usually decreases with the increase in wavelength. On the other hand, the high impurity concentration in the active region makes it difficult to obtain a desired photocurrent level since the life time of carriers generated in the active region by the irradiation of incident light and contributing to a photocurrent is shortened. According to the above approaches, it is thus difficult to obtain a high photo-electric conversion efficiency over a wide range of wavelengths. Also, those approaches have a drawback that the inverse withstand voltage of the resultant device becomes low. Accordingly, there is a limit to the attempt to improve the device performance by merely controlling the thickness of the active region and/or the impurity concentration in the active region. Therefore, a drastic reformation of the light detecting element structure is desired to perform the light detection with a high S/N ratio while reducing the dark current without degrading the photo-electric conversion efficiency.

A multi-channel detection scheme using such conventional photodiodes has already found its application in image sensors and position detectors. With the improvement of the stability and sensitivity of photodetectors themselves based on the development of semiconductor techniques, the application of the multi-channel detection scheme to spectral photometry has been proposed. Since in that case the reduction of size and weight and the improvement of performance can be expected, a self-scanning photodiode array incorporating a scanning circuit therein using a charge coupled device with photodiodes as light detecting means is considered to be a promising example. Scientific instruments such as spectrophotometers etc. must detect a weak light signal with high accuracy. In those applications, the most important thing is how small a level of incident light can be detected while keeping a predetermined S/N ratio. The light detection with the predetermined S/N ratio encounters a problem that the minimum detectable limit of incident light depends on the level of dark current. With a light detecting device having a self-scanning function, the noise from the scanning circuit as well as the internal noise due to dark current must be taken into consideration. If some measures to reduce the former noise are made, the latter noise arising in the light detecting element (i.e. photodiode) used will determine the detectable limit level. It is therefore most important to reduce the dark current of the light receiving section.

SUMMARY OF THE INVENTION

The object of this invention is to provide low dark current photodiodes or photo-semiconductor devices using such photodiodes.

Briefly, this invention is directed to a photo-semiconductor device comprising an active region of semiconductor material of one conductivity type in which carriers contributing to a photocurrent are generated by the irradiation of incident light and which has a main junction formed on one surface thereof, the carriers substantially moving towards the main junction. According to this invention, an additional region of semiconductor material of an opposite conductivity type is buried in the active region to form at the interface between the additional and active regions an additional junction which attracts a substantial portion of thermally generated carriers, the remaining portion of the thermally generated carriers being partially recombined internally and partially attracted to the main junction, whereby dark current is reduced.

Preferably, the additional region is buried at a position spaced within two times the diffusion length of minority carriers in the active region from the edge of a depletion layer formed under the main junction.

BRIEF DESCRIPTION OF THE DRAWING

FIG. 1 shows in cross section a photodiode as an embodiment of this invention.

FIG. 2 shows in cross section a photodiode as another embodiment of this invention.

FIG. 3 schematically shows the circuit of a self-scanning light detecting device in which the photodiodes of this invention are used.

FIG. 4 shows a concrete circuit of one example of a shift register as a constituent of the scanning circuit shown in FIG. 3.

FIG. 5 shows in cross section the combined structure of a photodiode and an MISFET which constitute one bit of the device shown in FIG. 3.

FIG. 6 shows an equivalent circuit of the stricture shown in FIG. 5.

DESCRIPTION OF THE PREFERRED EMBODIMENTS

FIG. 1 shows in cross section a $p^+nn^+$ type photodiode as an embodiment of this invention. The photodiode comprises an $n^+$-type semiconductor substrate 1, an n-type layer 2 and a $p^+$-type region 3 diffused in the surface of the n layer 2. The n layer 2 is a region serving to absorb incident light, that is, an active region in which carriers contributing to a photocurrent are generated by the irradiation of incident light. Reference numeral 4 designates a surface passivation film, numerals 5 and 6 electrodes in ohmic contact with the regions 1 and 3, numeral 14 an anti-reflection film and numeral 10 a photodetecting pn junction or a main junction towards which the carriers generated in the n layer 2 by the irradiation of incident light move.

In accordance with this invention, a p-type buried region 11 is formed between the $n^+$ layer and the n layer 2 and beneath the main junction 10. An additional junction 12 formed between the p buried region and the n layer 2 of high resistance serves as a port for collecting thermally generated carriers, like the main junction 10 formed near the light receiving surface. Therefore, a substantial portion of the carriers thermally generated in an area between the additional junction 12 and the edge of a depletion layer formed by reversely biasing the main junction 10 is attracted to the additional junction 12 and cannot reach the main junction 10. On the other hand, the remaining portion of the carriers are partially recombined internally and partially attracted to the main junction 10. Thus, the dark current of the photodiode is reduced.

It is preferable to form the p buried region 11 at a position spaced within two times the diffusion length of minority carriers in the n layer 2 from the edge of a depletion layer formed under the main junction 10. It should be understood that if the buried region 11 is formed at a position distanced by two times the carrier diffusion length from the edge of the depletion layer, the additional junction 12 will attract about half of the carriers generated thermally in the area between the edge of the depletion layer and the additional junction.

When incident light is irradiated on the photodiode, the light is absorbed exponentially with the distance from the surface. Except for the case of light having a very small absorption coefficient, therefore, most carriers generated by the irradiation of light in the n layer 2 are collected by the main junction 10, resulting in a photocurrent. If the incident light has a small absorption coefficient, the presence of the buried region 11 serving to reduce the dark current causes the reduction of photocurrent to a small extent. However, since the incident light is exponentially absorbed from the light receiving surface, the degree of the reduction of photocurrent due to the presence of the buried region 11 is smaller than that of dark current.

In the embodiment described above, the main junction is a pn junction, but the main junction may be a semiconductor-oxide junction using a surface inversion layer formed at the interface between silicon and a silicon dioxide ($SiO_2$), a semiconductor hetero junction formed between silicon and stannic oxide, or a so-called Schottky junction formed between metal and semiconductor.

FIG. 2 shows an example of a photodiode using a Schottky junction, as another embodiment of this invention. In FIGS. 1 and 2, the same reference numerals are used to designate equivalent parts. Referring to FIG. 2, a Schottky junction is formed at the interface between the n layer 2 and a thin light-transparent metal layer 15. The Schottky junction serves as the main junction as described above.

An application of the photodiode according to this invention will now be described in connection with the field of multi-channel spectral photometry or a light detecting apparatus using a self-scanning photodiode array.

To begin with, an outline of conventional spectral photometry will be briefly given. The light energy emitted from a light source is impinged on a dispersion element such as a prism or a grating through a suitable optical system. The dispersion element serves to separate the light energy into its various components at different wavelengths. The separated monochromatic light component having a particular wavelength is passed through a fixed slit onto a sample cell. The amount of light transmitted through the sample cell is finally detected by a photodetector such as a photocell. Monochromatic lights at different wavelengths can be selectively obtained through the fixed slit by rotating the dispersion element. In view of the fact that the dispersion element can provide various components at different wavelengths, there may be considered a scheme that while the dispersion element is kept immovable, an array of plural photodiodes is disposed to respectivly receive those components ranging from short to long wavelengths through the sample cell. FIG. 3 shows a circuit diagram of an example in which photodiodes fabricated according to this invention are used in such an arrangement.

The circuit shown in FIG. 3 incorporates therein an array of n photodiodes 30-1~30-n according to this invention. The photodiodes 30-1~30-n have their cathodes grounded and their anodes connected respectively with the sources of MISFETs 31-1~31-n. The drains of the MISFETs 31-1~31-n are connected in common with one end of a resistor R the other end of which is connected with one end of a voltage source V grounded at the other end. The gates of the MISFETs 31-1~31-n are connected respectively with the outputs of shift register $SR_1 \sim SR_n$ constituting a scanning circuit 32.

FIG. 4 shows a concrete example of one (for example, $SR_1$) of the shift registers constituting the scanning circuit 32. The shown shift register $SR_1$ comprises six MISFETs and serves to apply, under the control of two clock signals $\phi_1$ and $\phi_2$, an input voltage $V_g$ as sampling pulses to the gate of the MISFET 31-1 during a predetermined time (sampling period) so that the MISFET 31-1 may become conductive during the predetermined time. $V_{DD}$ indicates a power supply.

It will be understood that if in the circuit shown in FIG. 3 the number n of the photodiodes 30-1~30-n is set to 200 and the MISFETs 31-1~31-n are sequentially fired at a sampling period of 5 $\mu$sec, then the spectral measurement of light having wavelengths of, for example, 201~400 nm at intervals of 1 nm can be completed in 1000 $\mu$sec.

FIG. 5 shows in cross section the combined structure of a photodiode and a MISFET which constitute one bit of the circuit in FIG. 3 and FIG. 6 shows the equivalent circuit of the structure shown in FIG. 5. In FIG. 6, D and $I_\lambda$ designate the junction capacitance of the photodiode and the photocurrent. In FIG. 5, similar reference numerals are given to components equivalent to those shown in FIG. 1. A p-type source region 7A of the MISFET is formed through diffusion technique so as to be contiguous with the diffusion layer 3 of the photodiode. Reference symbol 7B designates a p-type drain region and numeral 8 a control gate electrode. Numeral 7 designates a surface protection and gate film. Numeral 9 designates a signal read-out electrode connected with the drain region 7B. With this structure, a photocurrent produced in response to an incident light is stored as electric charges in the junction capacitance D formed by reversely biasing the photodiode. The stored charges are detected in response to the sampling pulse applied to the gate electrode 8 of the MISFET from the scanning circuit 32. Thus, a signal output proportional to the incident light is produced from the electrode 9 on the basis of the detected quantity of the stored charges.

Referring to FIG. 3 and FIG. 6, the above-described mechanism of detection will be further detailed. When in the absence of any incident light the MISFETs 31-1~31-n (corresponding to a switch S shown in FIG. 6) are sequentially fired by a sampling pulse from the scanning circuit 32, electric charges A and A′ from the voltage source V are stored in the capacitance D of the main junction 10 for a sampling period determined by the scanning circuit 32, as shown in FIG. 6. When an incident light is irradiated onto the photodiode, the stored charges A and A′ are discharged by charges B and B′ shown in FIG. 6 having signs opposite to the charges A and A′, i.e. a photocurrent $I_\lambda$ proportional to the amount of the incident light. Upon the closure of the switch S in response to the next sampling pulse, a quantity of charges equal to the charges discharged by the photocurrent $I_\lambda$ is supplied into the capacitance D from the voltage source V. At the same time, the quantity of the resupplied charges is detected across the resistor R as a signal output $\Delta V$.

With this operating principle, the quantity of charges resupplied into the capacitance D increases with the duration or accumulation of the photocurrent $I_\lambda$, i.e. the inadiation time of the incident light. Therefore, unlike the ordinary instantaneous photometry using photodiodes, the photodetection gain proportional to the accumulation time of the photocurrent can be obtained. It is accordingly considered that if a sufficiently long duration of the photocurrent is adopted, even an incident light having a very low intensity level can be detected. In general, however, since the dark current of the photodiode exists even in the absence of any incident light, as described above, the dark current results in the accumulation of charges in the capacitance. Therefore, the light detection with a predetermined constant S/N ratio encounters a problem that the minimum detectable level of incident light depends on the dark current level. According to this invention, the photodiode is provided with the buried region 11 as shown in FIG. 5 so that the dark current level can be reduced to a minimum value, thereby making the light detection with high accuracy possible.

In FIG. 5, the source of the MISFET has been formed to be contiguous with one end portion of the diffused region 3 of the pn junction type photodiode as shown in FIG. 1. In the case where a Schottky junction type photodiode as shown in FIG. 2 is used, the source of the MISFET may be formed to overlap partially with one end portion of the Schottky junction 10 beneath the metal layer 15.

Next, description will be made of a method for fabricating such a structure as shown in FIG. 5 by using an n+-type silicon substrate.

The n+ substrate 1 was prepared with an antimony doped silicon wafer having a resistivity of 0.01 $\Omega$-cm and a thickness of 150~200 $\mu$m. A p-type region 11 was formed in the substrate 1 by selectively diffusing boron atoms at 1050° C. for 50 minutes by means of a well-known diffusion technique. Then, an n-type layer 2 having a resistivity of 5 $\Omega$-cm and a thickness of 10 $\mu$m was epitaxially grown on the substrate 1. In this case, the region 11 extended toward the n layer 2 through diffusion. Boron-diffused regions 7A and 7B of a diffusion depth of 1 $\mu$m serving as source and drain were formed in the n layer 2 through a well-known selective diffusion technique, and a boron-diffused layer 3 of a diffusion depth of 0.5 $\mu$m serving as photodiode region was thereafter formed through the same technique. While remaining an oxide film 4 used as a mask in the formation of the diffused regions 7A, 7B and 3, an oxide film 7 serving as gate and having a thickness of 0.1 $\mu$m was formed in the atmosphere of dry oxygen, to cover the diffused region 3. After removing an unwanted portion of the oxide film through a well-known selective photoetching technique, electrodes 8, 9 and a back electrode 6 were formed by vapor-depositing an aluminum layer on the resultant structure and by etching unwanted portions of the aluminum layer through a well-known photoetching technique.

Preferably, the impurity concentration of the p-type buried region 11 is chosen to be higher than that of the n layer 2 serving as the active region and lower than about $1 \times 10^{20}$ atoms/cm$^3$. If the impurity concentration of the buried region 11 is higher than $1 \times 10^{20}$ atoms/cm$^3$, defects induced by the impurity doping with high concentration may affect the active region to deteriorate electric characteristics of the device. An attempt to choose the impurity concentration of the region 11 to be lower than that of the n layer 2 would make the production of the device difficult.

A doped polycrystalline semiconductor layer such as a doped polycrystalline silicon layer can be used as the electrode 8, instead of an aluminum layer. A preferred method for fabricating the above-mentioned structure using a doped poly-silicon film as the electrode 8 is as follows.

After an n-type layer 2 was epitaxially grown on the substrate 1, the top surface of the n-type layer was covered with an $SiO_2$ film by means of a well known thermal oxidation technique, for example. Further, the top surface of the $SiO_2$ film was covered with a poly-silicon film.

Next, an unwanted portion of the poly-silicon film was removed through a well known selective photoetching technique and the residual portion of the poly-silicon film was employed for the electrode 8. Leaving a portion corresponding to source 7A and drain 7B, the $SiO_2$ film was selectively removed through a well known photoetching technique with the electrode 8 used as a part of masks. Processes which follow this photoetching are the same as the aforementioned processes, that is, selective diffusion of boron atoms into the substrate 1, etc.

The merit resulting from employing a polycrystalline semiconductor layer for the electrode 8 lies in that since the edges of source 7A, drain 7B are self-aligned with the edge of the electrode 8, high reproducibility and high reliability of such devices are obtained.

The process of fabricating the photodiode shown in FIG. 1 or 2 will be apparent to those skilled in the art from the foregoing detailed description.

In the embodiments described above, the p-type buried region has been formed exclusively at the interface between the $n^{30}$ layer and the n layer. However, the p-type buried region may be formed in the n layer which has an increased thickness. Alternatively, the p-type buried region may be formed in a single n layer substituted for the double-layer structure of the $n^+$ and n layers. In either case, it is preferable to form the p-type buried region at a position spaced within two times the diffusion length of minority carriers in the n layer from the edge of a depletion layer formed under the main junction.

Further, though an $n^+$-type silicon substrate has been used in every embodiment described above, it is needless to say that the same results can be obtained even if a $p^+$-type silicon substrate is used in place of the $n^+$ silicon substrate with the conductivity types of all the regions inverted even if semiconductor material other than silicon is used.

The effects resulting from this invention will be summed up as follows:

(i) Since the dark current is reduced, an incident light having a lower intensity level can be detected.

(ii) The application of this invention to the self-scanning photodiode array allows the charge accumulation time to be set sufficiently long so that the limit to the detectable level of light having a low intensity can be made as low as half that in the prior art.

(iii) Due to the provision of the buried region 11, the photo-electric conversion efficiency is little affected for light of shorter wavelengths but it slightly decreases for light of longer wavelengths. The degree of this decrease is smaller than that of decrease in the dark current. This decrease in sensitivity for longer wavelengths also provides a merit that in an ordinary spectrophotometer using a tungsten lamp having its luminous intensity high over longer wavelengths rather than shorter ones, unwanted effects caused by stray light of longer wavelengths are reduced in the detection of light of shorter wavelengths.

We claim:

1. A photodiode consisting essentially of:
   (a) a first semiconductor region of one conductivity type having a first predetermined impurity concentration;
   (b) a second semiconductor region of said one conductivity type on said first region having a second predetermined impurity concentration lower than said first predetermined impurity concentration;
   (c) a third semiconductor region of an opposite conductivity type on and adjoining said second region, said third and second regions forming a photodetecting pn junction therebetween; and
   (d) a fourth semiconductor region of said opposite conductivity type buried between said first and second regions, said fourth and second regions forming an additional pn junction therebetween.

2. A photodiode according to claim 1, wherein said fourth region is buried at a position spaced within two times the diffusion length of minority carriers in said second region from the bottom of a depletion layer formed under said photodetecting pn junction by applying a reverse bias between said first and third regions.

3. In a photodiode comprising an active region of semiconductor material of one conductivity type in which carriers contributing to a photocurrent are generated by the irradiation of incident light and which has a photodetecting junction formed on one surface thereof for collecting said carriers,
   the improvement in which an additional region of semiconductor material of an opposite conductivity type is buried in said active region to form at the interface between said additional region and said active region a pn junction which attracts a substantial portion of thermally generated carriers, the remaining portion of said thermally generated carriers being partially recombined internally and partially collected to said photodetecting junction, whereby dark current due to said thermally generated carriers is reduced.

4. A photodiode according to claim 3, wherein said additional region is buried at a position spaced within two times the diffusion length of minority carriers in said active region from the bottom of a depletion layer formed under said photodetecting junction by reversely biasing said photodetecting junction.

5. A photodiode comprising:
   (a) a semiconductor body having opposed first and second major surfaces;
   (b) a first region of one conductivity type in said semiconductor body extending to said first major surface;
   (c) a second region of an opposite conductivity type in said semiconductor body adjoining said first region and extending to said second major surface, said second and first regions forming a photodetecting pn junction therebetween for collecting carriers generated by the irradiation of incident light;
   (d) a third region of said opposite conductivity type buried in said first region, said third and first regions forming at an interface therebetween a pn junction for collecting thermally generated carriers;
   (e) a first electrode formed on said first major surface in ohmic contact with said first region; and
   (f) a second electrode formed on said second major surface in ohmic contact with said second region.

6. A photodiode comprising:

(a) a semiconductor body of one conductivity type having opposed first and second major surfaces;

(b) a metal layer formed on said second major surface, said metal layer and said semiconductor body forming a photodetecting metal-semiconductor Schottky junction therebetween for collecting carriers generated by the irradiation of incident light;

(c) a semiconductor region of an opposite conductivity type buried in said semiconductor body, said semiconductor region and said semiconductor body forming at an interface therebetween a pn junction for collecting thermally generated carriers;

(d) a first electrode formed on said first major surface in ohmic contact with said semiconductor body; and (e) a second electrode formed on said second main surface in contact with said metal layer.

7. A self-scanning photodiode-MISFET light detector device comprising:

(a) a semiconductor body of one conductivity type having opposed first and second major surfaces;

(b) a first electrode formed on and in ohmic contact with said first major surface;

(c) a first region of an opposite conductivity type in said semiconductor body extending from a first area of said second major surface, said first region and said semiconductor body forming a photodetecting pn junction at an interface therebetween for collecting carriers generated by the irradiation of incident light;

(d) a second region of said opposite conductivity type buried in said semiconductor body below said first region, said region and said semiconductor body forming at an interface therebetween a pn junction for collecting thermally generated carriers;

(e) spaced third and fourth regions of said opposite conductivity type as source and drain in said semiconductor body extending from a second area of said second major surface, said third region being contiguous with said first region;

(f) an insulator film formed on said second major surface between said third and fourth regions;

(g) a second electrode as a control gate formed on said insulator film, a scanning signal being applied to said second electrode; and (h) a third electrode for light signal read out formed on and in ohmic contact with said fourth region.

8. A self-scanning photodiode-MISFET light detector device according to claim 7, wherein said second electrode is composed of doped polycrystalline semiconductor.

9. A photodiode according to claim 5, wherein said third region is buried at a position spaced within two times the diffusion length of minority carriers in said first region from the bottom of a depletion layer formed under said photodetecting junction by applying a voltage between said first and second electrodes which reversely biases said photodetecting junction.

10. A photodiode according to claim 5, wherein said third region has an impurity concentration lower than $1 \times 10^{20}$ atoms/cm$^3$.

11. A photodiode according to claim 10, wherein the impurity concentration of said third region is higher than that of said first region.

12. A photodiode according to claim 6, wherein said semiconductor region is buried at a position spaced within two times the diffusion length of minority carriers in said semiconductor body from the bottom of a depletion layer formed under said photodetecting junction by applying a voltage between said first and second electrode which reversely biases said photodetecting junction.

13. A photodiode according to claim 6, wherein said semiconductor region has an impurity concentration lower than $1 \times 10^{20}$ atoms/cm$^3$.

14. A photodiode according to claim 13, wherein the impurity concentration of said semiconductor region is higher than that of said semiconductor body.

15. A self-scanning photodiode-MISFET light detector device according to claim 7, wherein said second region is buried at a position spaced within two times the diffusion length of minority carriers in said semiconductor body from the bottom of a depletion layer formed under said photodetecting junction by reversely biasing said photodetecting junction.

16. A photodiode consisting essentially of:

(a) a first semiconductor region of one conductivity type having a first predetermined impurity concentration;

(b) a second semiconductor region of said one conductivity type on said first semiconductor region having a second predetermined impurity concentration lower than said first predetermined impurity concentration;

(c) a metal layer on and adjoining said second semiconductor region, said metal layer and said second semiconductor region forming a photodetecting metal-semiconductor Schottky junction therebetween; and (d) a third semiconductor region of said opposite conductivity type buried between said first and second semiconductor regions, said third and second semiconductor regions forming a pn junction therebetween.

17. A photodiode according to claim 16, wherein said third semiconductor region is buried at a position spaced within two times the diffusion length of minority carriers in said second semiconductor region from the bottom of a depletion layer formed under said photodetecting junction by applying a reverse bias between said first semiconductor region and said metal layer.

18. In a photodiode comprising an active region of semiconductor material of one conductivity type in which carriers contributing to a photo-current are generated by the irradiation of incident light and which has a photodetecting junction formed on one surface thereof for collecting said carriers, the improvement comprising:

means to reduce dark current by attracting thermally generated carriers away from said photodetecting junction.

19. The improvement according to claim 18, wherein said means comprises a pn junction.

20. The improvement according to claim 18, wherein said means comprises a semiconductor material of an opposite conductivity type buried in said active region.

* * * * *